United States Patent
Gardner et al.

[19]

[11] Patent Number: 6,097,062
[45] Date of Patent: Aug. 1, 2000

[54] OPTIMIZED TRENCH EDGE FORMATION INTEGRATED WITH HIGH QUALITY GATE FORMATION

[75] Inventors: Mark I. Gardner, Cedar Creek; H. Jim Fulford; Derick J. Wristers, both of Austin, all of Tex.

[73] Assignee: Advanced Micro Devices, Inc., Sunnyvale, Calif.

[21] Appl. No.: 08/928,821

[22] Filed: Sep. 12, 1997

[51] Int. Cl.[7] .................................................. H01L 29/72
[52] U.S. Cl. ........................... 257/333; 257/395; 257/411
[58] Field of Search ................................... 257/411, 395, 257/333

[56] References Cited

U.S. PATENT DOCUMENTS

| | | | |
|---|---|---|---|
| 4,096,522 | 6/1978 | Suzuki et al. | 357/45 |
| 4,375,643 | 3/1983 | Yeh et al. | 357/15 |
| 4,412,378 | 11/1983 | Shinada | 29/578 |
| 4,498,227 | 2/1985 | Howell et al. | 29/576 |
| 4,926,222 | 5/1990 | Kosa et al. | 357/23.5 |
| 4,962,413 | 10/1990 | Yanazaki et al. | 357/42 |
| 5,497,021 | 3/1996 | Tada | 257/369 |

OTHER PUBLICATIONS

Wolf et al., *Silicon Processing for the VLSI Era—vol. 1: Process Technology*, 1986 Lattice Press, p. 183.

*Primary Examiner*—Edward Wojciechowicz
*Attorney, Agent, or Firm*—Kevin L. Daffer; Conley, Rose & Tayon

[57] ABSTRACT

A semiconductor manufacturing process is provided in which an oxidation retarding species is introduced into regions of the substrate distal from the isolation structures. A subsequent thermal oxidation process results in the formation of a gate dielectric film in which the film thickness proximal to the isolation structures is greater than the film thickness distal from the isolation structures. Broadly speaking, an isolation structure is formed in an isolation region of a semiconductor substrate. A mask is then formed on an upper surface of the semiconductor substrate. The mask covers the isolation structure and portions of the semiconductor substrate proximal to the isolation structure. A nitrogen bearing impurity distribution is then introduced into portions of the semiconductor substrate exposed by the mask. The nitrogen bearing impurity distribution therefore substantially resides within portions of the semiconductor substrate distal from the isolation structures. A gate dielectric is then formed on an upper surface of the semiconductor substrate. An oxidation rate of the distal portions of the semiconductor substrate is less than an oxidation rate of the proximal portions. In this manner, a thickness of the gate oxide is greater over the proximal portions of the substrate than over the distal portions.

7 Claims, 1 Drawing Sheet

OPTIMIZED TRENCH EDGE FORMATION INTEGRATED WITH HIGH QUALITY GATE FORMATION

BACKGROUND OF THE INVENTION

1. Field of the Invention

The present invention relates to the field of semiconductor processing and more particularly to a method of forming a gate dielectric with an increased thickness in regions of the integrated circuit proximal to boundaries of the isolation structures.

2. Description of the Relevant Art

The fabrication of MOS (metal-oxide-semiconductor) transistors within a semiconductor substrate is well known. Typically, the substrate is divided into a plurality of active and isolation regions through an isolation process such as field oxidation or shallow trench isolation. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, an implant is performed to introduce an impurity distribution into the source/drain regions.

As transistor channels shrink below 0.5 microns, the limitations of conventional transistor processing become more apparent. To combat short channel effects in deep sub-micron transistors, the depth of the source/drain junctions and the thickness of the gate oxides must be reduced. Devices become more susceptible, however, to breakdown due to electrical stress across the oxide. In a conventional sub-half-micron transistors, for example, gate dielectric thickness in the range of approximately 50 angstroms are not uncommon. If a 3.3 volt potential is applied across this film, a common occurrence in MOS transistors, the resulting electrical field has a nominal value in the range of approximately 3.3 MV/cm. In regions of the underlying gate dielectric proximate to geometric discontinuities, a localized electric field can greatly exceed the nominal value and can cause dielectric breakdown. Accordingly, it has been theorized that the gate dielectric is more likely to breakdown in regions of the device adjacent or proximal to isolation structures and, more particularly, shallow trench isolation structures, where discontinuities in the underlying substrate are common and can result in electrical fields exceeding 6 MV/cm, which is considered to be an upper limit on the electrical field sustainable by a thermally formed $SiO_2$ film. See, e.g., 1 S. Wolf & R. Tauber, *Silicon Processing for the VLSI Era* 183 (Lattice Press 1986) [hereinafter "Wolf Vol. 1"].

Despite the problem of dielectric, thin gate dielectrics are desirable in the active regions of a device because the transistor drive current is inversely proportional to the gate oxide thickness over a wide range of operating conditions. Because higher drive currents result in faster devices, a great deal of effort has been directed towards reducing the gate oxide thickness (as well as other transistor geometries including channel length and junction depth) without significantly reducing the reliability of the integrated circuit.

Therefore, it would be highly desirable to fabricate a gate dielectric that simultaneously possessed the requisite thinness in critical active regions of the device and an improved resistance to dielectric breakdown in regions of the device proximal to discontinuities in the dielectric.

SUMMARY OF THE INVENTION

The problems identified above are in large part addressed by a semiconductor manufacturing process in which an oxidation retarding species is introduced into regions of the substrate distal from the isolation structures. A subsequent thermal oxidation process results in the formation of a gate dielectric film in which the film thickness proximal to the isolation structures is greater than the film thickness distal from the isolation structures.

Broadly speaking, the present invention contemplates a semiconductor process in which an isolation structure is formed in an isolation region of a semiconductor substrate. A mask is then formed on an upper surface of the semiconductor substrate. The mask covers the isolation structure and portions of the semiconductor substrate proximal to the isolation structure. A nitrogen bearing impurity distribution is then introduced into portions of the semiconductor substrate exposed by the mask. The nitrogen bearing impurity distribution, therefore, substantially resides within portions of the semiconductor substrate distal from the isolation structures. After removing the mask from the semiconductor substrate, a gate dielectric is then formed on an upper surface of the semiconductor substrate. An oxidation rate of the distal portions of the semiconductor substrate is less than an oxidation rate of the proximal portions. In this manner, a thickness of the gate oxide is greater over the proximal portions of the substrate than over the distal portions.

In a preferred embodiment, the semiconductor substrate includes a p-type epitaxial layer formed over a p+ silicon bulk. A resistivity of the epitaxial layer is in the range of approximately 10 to 15 $\Omega$-cm. The step of forming the isolation structure preferably includes etching an isolation trench into the isolation region of the semiconductor substrate, filling the isolation trench with a trench dielectric, and planarizing the isolation dielectric to remove portions of the dielectric exterior to the isolation trench. In one embodiment, the filling of the isolation trench with a trench dielectric is accomplished by thermally decomposing TEOS within a plasma enhanced chemical vapor deposition reactor chamber maintained at a temperature in the range of approximately 650° C. to 750° C. Preferably, the proximal portions of the semiconductor substrate comprise those portions of the substrate within approximately 200 angstroms of the isolation structure. The introduction of the nitrogen bearing impurity distribution is preferably accomplished by ion implantation. Suitable implant species include, among others, N, $N_2$, $N_2O$, and NO. A suitable implant dose is preferably in the range of approximately $1\times10^{14}$ to $1\times10^{15}$ atoms/cm² while a suitable implant energy is typically in the range of approximately 10 to 50 keV. The formation of the gate dielectric is typically accomplished by immersing the semiconductor substrate into an oxygen bearing ambient maintained at a temperature in the range of approximately 500° C. to 900° C. The thickness of the gate oxide is in the range of approximately 15 to 50 angstroms over the distal portions of the semiconductor substrate while a thickness of the oxide over proximal portions of the substrate is in the range of approximately 30 to 100 angstroms. The process may further include the formation of a conductive gate structure on an upper surface of the gate dielectric. In this embodiment, the formation of the conductive gate structure is typically accomplished by depositing polysilicon with a thermal decomposition of silane in a chemical vapor deposition reactor chamber maintained at a temperature of approximately 580° C. to 650° C. An impurity distribution is then introduced into the deposited polysilicon to reduce a sheet resistivity of the polysilicon to less than approximately 500 $\Omega$/square. A patterned photoresist mask is then formed on an upper surface of the deposited polysilicon and the exposed portions of the polysilicon are then removed with a plasma etch process. The introduction of the impurity distribution into the deposited polysilicon is preferably accomplished with an ion implantation process using an implant species selected from the group consisting of boron, arsenic, and phosphorous.

The present invention still further contemplates an integrated circuit including a semiconductor substrate including at least one isolation region, an isolation structure formed in the isolation region, and a gate dielectric layer formed on an upper surface of the substrate. The gate dielectric layer includes a first thickness over regions of the substrate distal from the isolation structure. The gate dielectric has a second thickness over regions of the substrate that are proximal to the isolation structures. The isolation dielectric is suitably comprised of a silicon-oxide composite. The gate dielectric layer preferably comprises a thermal oxide layer. A first thickness of the gate dielectric layer is suitably in the range of approximately 15 to 50 angstroms. A second thickness of the gate dielectric is in the range of approximately 30 to 100 angstroms. The integrated circuit may further include a conductive gate structure formed on an upper surface of the gate dielectric. The conductive gate structure extends over the distal and proximal regions of the semiconductor substrate.

BRIEF DESCRIPTION OF THE DRAWINGS

Other objects and advantages of the invention will become apparent upon reading the following detailed description and upon reference to the accompanying drawings in which.

Figure 1:
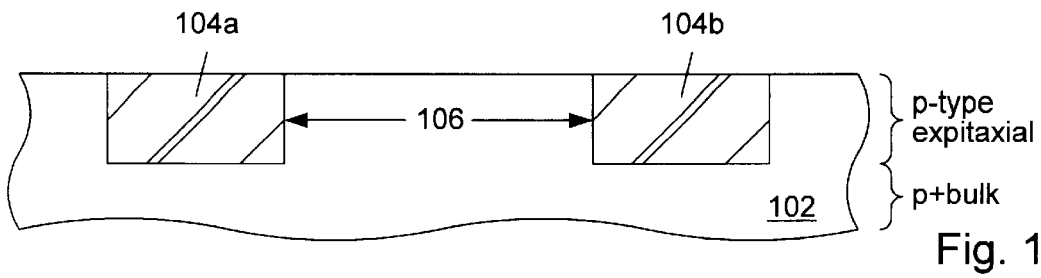
FIG. 1 is a partial cross-sectional view of the semiconductor substrate including a pair of isolation structures laterally disposed on either side of an active region of the substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIGS. 1–4 show one embodiment of the processing sequence designed to fabricate a dual thickness dielectric layer for improving oxide quality in the peripheral portions of the active regions of the substrate. Semiconductor substrate 102 includes at least one isolation structure 104a. In the embodiment shown in FIG. 1, substrate 102 includes a pair of isolation structures 104a and 104b laterally displaced on either side of an active region 106. As will be appreciated by those skilled in the art, isolation structures 104a and 104b provide physical and electrical separation between adjacent transistors. Active region 106 represents a region of substrate 102 into which a transistor will be formed during subsequent processing. The isolation structures representing by isolation structures 104a and 104b are of the shallow trench isolation variety. In a shallow trench isolation structure, a dielectric material is deposited into a trench that has been previously etched into the semiconductor substrate. The trench dielectric material is suitably comprised of a chemically vapor deposited silicon-oxide composite. The isolation trenches into which the isolation dielectric material is deposited is typically formed by a plasma etch process prior to which an isolation masking layer is patterned on an upper surface of substrate 102. After the deposition of isolation dielectric material, portions of the dielectric material exterior to the isolation trench are removed with a planarization process such as a chemical mechanical polish or a resist/etchback process to produce a substantially planar upper surface on the semiconductor substrate onto which the subsequent processing steps may be suitably executed.

Preferably, semiconductor substrate 102 comprises a single crystal silicon wafer of approximately 150 mm–200 mm in diameter. In one embodiment useful in the fabrication of CMOS integrated circuits, semiconductor substrate 102 includes a p-type epitaxial layer formed over a p+ silicon bulk. In this embodiment, a resistivity of the p-type type epitaxial layer is preferably in the range of approximately 10 to 15 $\Omega$-cm.

Figure 2:
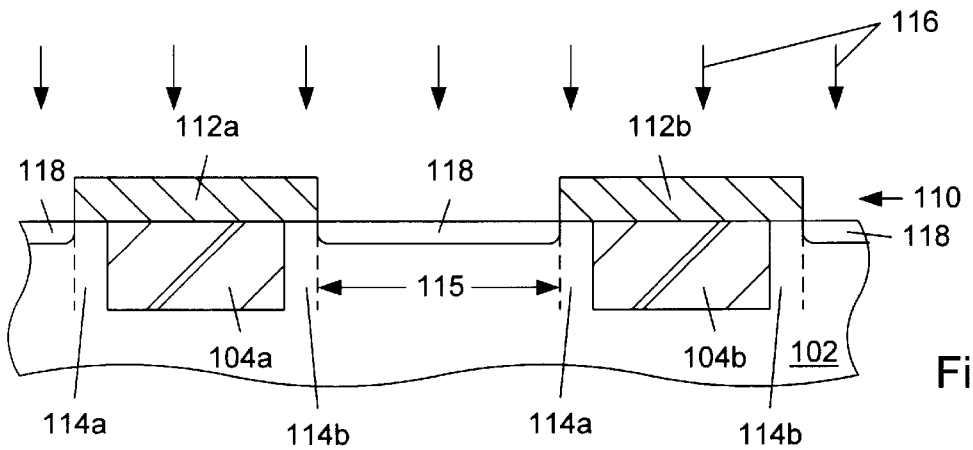
FIG. 2 is a processing step subsequent to FIG. 1 in which a masking layer has been formed on an upper surface of the substrate and an impurity distribution introduced into the substrate.

Turning now to FIG. 2, a mask 110 is formed on an upper surface of semiconductor substrate 102. Mask 110 includes first and second masking structures 112a and 112b. Mask 110 covers isolation structures 104a and 104b and portions of semiconductor substrate proximal to isolation structures 104a and 104b. The proximal region of substrate 102 is represented in FIG. 2 by reference numerals 114a and 114b. The formation of mask 110 is accomplished, in the preferred embodiment, with a conventional combination of photoresist and photolithography processing. In the preferred embodiment, the regions 114 proximal to the isolation structures 104 are preferably within approximately 200 angstroms of the isolation structures.

After the formation of mask 110, a nitrogen bearing impurity distribution is introduced into the exposed portions of semiconductor substrate 102. Because the mask 110 covers the proximal portions 114 of substrate 102, the nitrogen bearing impurity distribution 118 is electrically introduced into the region 115 of substrate 102 distal from the isolations structures 104. In the preferred embodiment, the introduction of the nitrogen bearing impurity distribution 118 is accomplished with an ion implantation process represented in FIG. 2 by reference numeral 116. In a presently preferred embodiment, ion implantation process 116 introduces a nitrogen bearing implant species such as N, $N_2$, $N_2O$, NO, or other suitable nitrogen species. A preferred dose for the ion implantation process 116 is in the range of approximately $1\times10^{14}$ to $1\times10^{15}$ atoms/cm$^2$ while a preferred implant energy is the range of approximately 10 to 50 keV.

Figure 3:
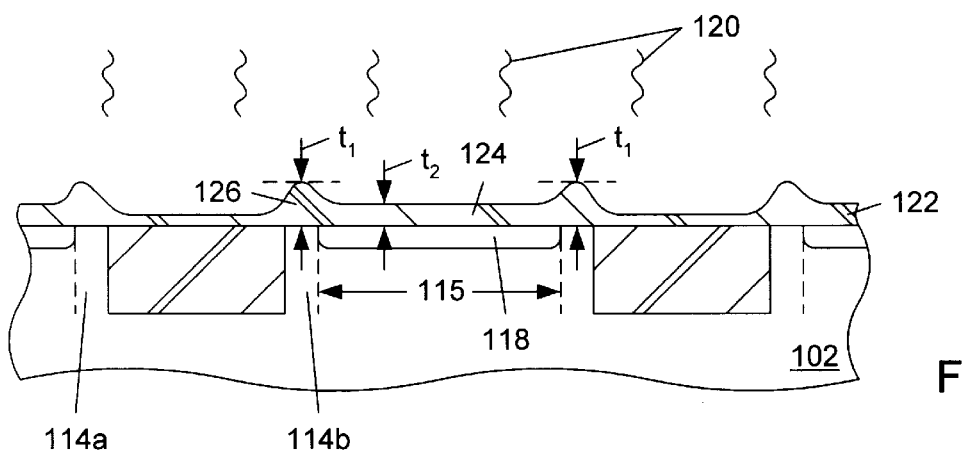
FIG. 3 is a processing step subsequent to FIG. 2 in which the gate dielectric layer is formed with a thermal oxidation processing resulting in a first thickness of the gate dielectric proximal to the isolation structures and a second thickness distal from the isolation structures.

Turning now to FIG. 3, gate dielectric 122 is formed with a thermal oxidation process represented in FIG. 2 by reference numeral 120. The preferred thermal oxidation process is accomplished by immersing substrate 102 into an oxygen bearing ambient maintained at a temperature in the range of approximately 500° C. to 900° C. The presence of the nitrogen bearing impurity distribution 118 within the distal regions 115 of substrate 102 results in a reduced oxidation rate at the silicon surface within the distal region 115 of substrate 102. It is theorized that the presence of nitrogen reduces the rate at which silicon atoms within substrate 102 can migrate to the surface and react with the oxygen within the oxygen bearing ambient. The reduced silicon mobility, in turn, results in the reduced oxidation rate. Because the impurity distribution is selectively restricted to the distal regions 115 of substrate 102, the lower oxidation rate is correspondingly restricted to those portions of gate dielectric 122 that reside over distal region 115 of substrate 102. This portion of the gate dielectric film is represented in FIG. 3 by reference numeral 124.

The substantial lack of nitrogen impurities within the proximal portions 114 of semiconductor substrate results in a relatively higher oxidation rate of the portion of the gate dielectric 122 residing above proximal portions 114. The relatively higher oxidation rate results in a thicker dielectric film above the proximal portions 114 relative to the portions of gate dielectric 122 over distal portions 115 of substrate 102. These relatively thick portions of gate dielectric 122 are represented in FIG. 3 by reference numeral 126. Accordingly, gate dielectric 122 of the present invention is characterized by a first thickness $t_1$ in those portions of the film residing over proximal portions 114 of substrate 102. Gate dielectric 122 is further characterized by a second thickness $t_2$ in portions 124 of gate dielectric 122 residing over distal portions 115 of substrate 102. In one presently preferred embodiment, the range of first thickness $t_1$ of gate dielectric 122 is in the range of approximately 30 to 100 angstroms while the second thickness $t_2$ of gate dielectric 122 is in the range of approximately 15 to 50 angstroms.

It will be appreciated to those skilled in the art that the gate dielectric 122 as shown in FIG. 3 is thicker over active portions of the substrate that are proximal to the isolation structures. This thicker gate dielectric in the vicinity of the isolation structures advantageously provides a thicker dielectric in portions of the device in which higher electric fields are generated. More specifically, because the discontinuity in the underlying substrate caused by the presence of the shallow trench isolation structure 104 may result in an electric field that is higher in the vicinity of the discontinuity in the electric field over the distal portions of substrate 102 (where the localized continuity helps to minimize the electric field). It will be apparent to those skilled in the art that, if an electric field generated by a particular structure results in a higher electric field value in peripheral portions of the structure, it is desirable to selectively increase the dielectric across which the electric field is sustained to reduce the field strength endured by the dielectric in the high field regions of the device without unnecessarily increasing the dielectric in the relatively low field regions of the device.

Figure 4:
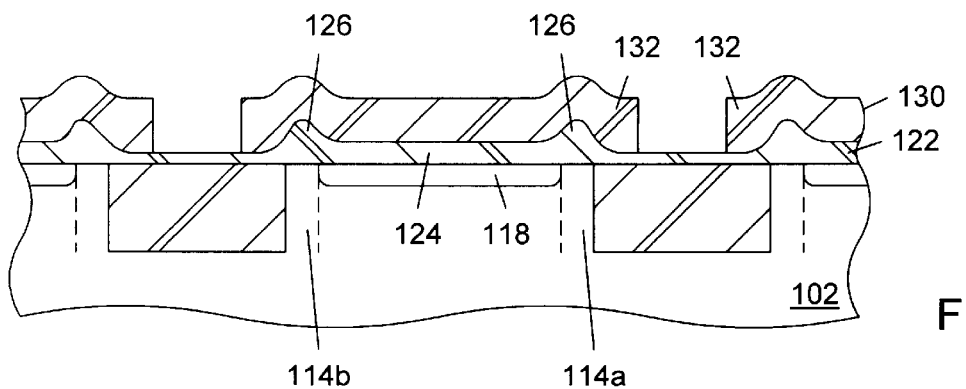
FIG. 4 is a processing step subsequent to FIG. 3 in which a conductive gate structure is formed over another surface of the gate dielectric.

Turning now to FIG. 4, conductive gate structures 132 are fabricated from conductive gate layer 130. In the preferred embodiment, the conductive gate structures 132 are typically fabricated by deposited polysilicon on an upper surface of gate dielectric 122. The deposition of polysilicon is suitably accomplished by thermally decomposing silane in a CVD reactor chamber maintained at a temperature in the range of approximately 580° C. to 650° C. After the deposition of the polysilicon, an impurity distribution is suitably introduced into the deposited polysilicon to "dope" or reduce the sheet resistivity of the polysilicon to less than approximately 500 Ω/square. After the doping of the polysilicon layer, a patterned photoresist mask is formed on an upper surface of the polysilicon and the exposed portions of the polysilicon are then plasma etched to produce the conductive gate structures 132 shown in FIG. 4. Those skilled in semiconductor processing will recognize conductive gate structures 132 as representative of gate structures used for MOS transistors.

It will be appreciated to those skilled in the art that the present invention represents a method of selectively reducing the field strength endured by a gate dielectric layer in regions of an MOS transistor that generate a higher electric field. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. An integrated circuit comprising:

a semiconductor substrate, wherein said semiconductor substrate includes at least one isolation region;

an isolation structure formed in said isolation region of said semiconductor substrate; and a gate dielectric layer formed on an upper surface of said semiconductor substrate, wherein said gate dielectric layer comprises a first thickness over regions of said semiconductor substrate proximal to said isolation structure, and further wherein said gate dielectric comprises a second thickness over regions of said semiconductor substrate distal from said isolation structure and said first thickness is greater than said second thickness.

2. The integrated circuit of claim 1, wherein said semiconductor substrate comprises a p-type epitaxial layer formed on a p+ silicon bulk, wherein a resistivity of said p-type epitaxial layer is in the range of approximately 10 to 15 Ω-cm.

3. The integrated circuit of claim 1, wherein said isolation structure comprises an isolation dielectric within an isolation trenched formed in said isolation region of said semiconductor substrate.

4. The integrated circuit of claim 3, wherein said isolation dielectric comprises silicon-oxide.

5. The integrated circuit of claim 1, wherein said gate dielectric layer comprises a thermal oxide.

6. The integrated circuit of claim 5, wherein said first thickness of said gate dielectric is in the range of approximately 30 to 100 angstroms and further wherein a second thickness of said gate dielectric is in the range of approximately 15 to 50 angstroms.

7. The integrated circuit of claim 1, further comprising a conductive gate structure formed on an upper surface of said gate dielectric, wherein said conductive gate structure extends over said distal and proximal regions of said semiconductor substrate.

* * * * *